United States Patent [19]

Tamai

[11] Patent Number: 5,764,033

[45] Date of Patent: Jun. 9, 1998

[54] RECHARGEABLE BATTERY PROTECTION CIRCUIT

[75] Inventor: Mikitaka Tamai, Tsung-gun, Japan

[73] Assignee: Sanyo Electric Co., Ltd., Osaka, Japan

[21] Appl. No.: 822,493

[22] Filed: Mar. 24, 1997

[30] Foreign Application Priority Data

Mar. 28, 1996 [JP] Japan ................... 8-074736

[51] Int. Cl.$^6$ ............................................. H01M 10/46
[52] U.S. Cl. ............................................. 320/132; 320/136
[58] Field of Search ......................... 320/5, 14, 21, 320/31, 32, 37, 39, 133, 132, 134, 136, DIG. 21

[56] References Cited

U.S. PATENT DOCUMENTS

| | | | |
|---|---|---|---|
| 5,397,974 | 3/1995 | Tamai et al. | 320/13 |
| 5,477,124 | 12/1995 | Tamai | 320/13 |
| 5,477,130 | 12/1995 | Hashimoto et al. | 320/49 |
| 5,493,197 | 2/1996 | Eguchi et al. | 320/5 |
| 5,526,215 | 6/1996 | Higashijima et al. | 361/86 |
| 5,585,994 | 12/1996 | Tamai et al. | 361/98 |

FOREIGN PATENT DOCUMENTS

| | | |
|---|---|---|
| 63-158744 | 7/1988 | Japan . |
| 6-284594 | 10/1994 | Japan . |

*Primary Examiner*—Edward Tso
*Attorney, Agent, or Firm*—Wenderoth, Lind & Ponack, L.L.P.

[57] ABSTRACT

The rechargeable battery protection circuit of this invention is provided with a switching system connected in series with the rechargeable battery, a current detection system to measure charging current flowing through the rechargeable battery, and a control system to control the switching system on and off depending on measurement results from the current detection system. The control system puts the switching system in the off state when charging current greater than a specified value flows through the rechargeable battery. This prevents rechargeable battery charging with excessive current.

5 Claims, 3 Drawing Sheets

RECHARGEABLE BATTERY PROTECTION CIRCUIT

BACKGROUND OF THE INVENTION

This invention relates to a rechargeable battery protection circuit, and in particular to a circuit that protects rechargeable batteries from charging by excessively large charging currents.

If a rechargeable battery, such as a nickel-cadmium battery, a nickel-hydrogen battery, or a lithium ion rechargeable battery is charged or discharged with excessive current, battery performance is degraded, and furthermore, battery life is markedly shortened. Circuits employing circuit breakers or PTC devices to prevent rechargeable battery discharge with excessive current are disclosed by Japanese Non-examined Patent Publication No. 63-158744 issued Jul. 1, 1988.

Circuits described by this and other disclosures can prevent discharge with excessive current, but cannot prevent charging with excessive current. For this reason, battery performance degradation due to rechargeable battery charging with excessive current is possible.

The present invention was developed to overcome this disadvantage. It is thus a primary object of the present invention to provide a rechargeable battery protection circuit that protects batteries from being charged with excessive current during rechargeable battery charging.

The above and further objects and features of the invention will more fully be apparent from the following detailed description with accompanying drawings.

SUMMARY OF THE INVENTION

The rechargeable battery protection circuit of the present invention is provided with a switching system connected in series with the rechargeable battery, a current detection system to measure charging current flowing through the rechargeable battery, and a control system to control the switching system on and off depending on measurement results from the current detection system. The control system puts the switching system in the off state when charging current greater than a specified value flows through the rechargeable battery.

Preferably, the control system puts the switching system in the off state when charging current greater than the specified value flows through the rechargeable battery for a time longer than a first specified time interval. Further, the control system resets the switching system to the on state when a second prescribed time interval has elapsed after the switching system is put in the off state.

Since the rechargeable battery protection circuit of the present invention puts the switching system in the off state to suspend charging when charging current greater than the specified value flows in a battery being charged, excessively large charging current is prevented from flowing in the rechargeable battery and battery degradation due to charging is suppressed.

DETAILED DESCRIPTION OF THE INVENTION

Figure 1:
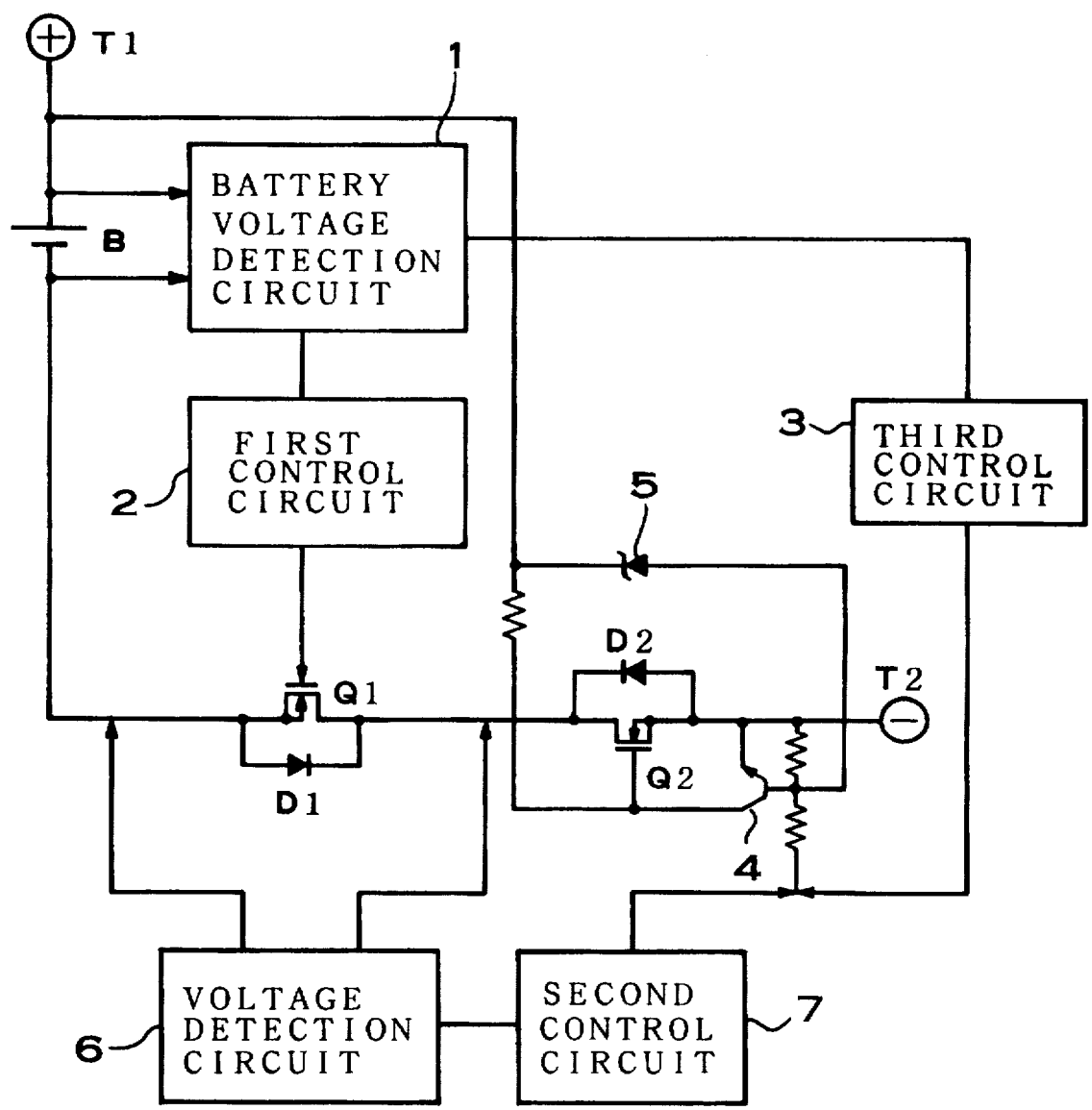
FIG. 1 is a circuit diagram showing an embodiment of the present invention.

FIG. 1 is a circuit diagram showing a battery pack containing a protection circuit which is an embodiment of the present invention. In this battery pack, a lithium ion rechargeable battery (referred to below as simply the rechargeable battery) B, a discharge control transistor Q1 which is the discharge control switching system, and a charging control transistor Q2 which is the charging control switching system, are connected in series between a pair of charge-discharge terminals T1 and T2. The discharge control transistor Q1 and the charging control transistor Q2 are made up of metal-oxide-semiconductor field effect transistors (MOSFETs), and these MOSFETs are connected with their drains together. Here, the diodes D1 and D2, connected in parallel with discharge control transistor Q1 and charging control transistor Q2, are parasitic diodes of the MOSFETs.

The discharge control transistor Q1 is controlled by a discharge control circuit. The discharge control circuit is provided with a battery voltage detection circuit 1 and a first control circuit 2. The charging control transistor Q2 is controlled by a charging control circuit. The charging control circuit is provided with a third control circuit 3, a transistor 4, a voltage detection circuit 6, and a second control circuit 7.

The battery voltage detection circuit 1 measures rechargeable battery B voltage. The first control circuit 2 controls the discharge control transistor Q1 on and off based on the battery voltage measured by the battery voltage detection circuit 1. Namely, when rechargeable battery voltage is above a discharge cut-off voltage Vd (for example, 2.30V), the first control circuit 2 maintains the discharge control transistor Q1 in the on state. However, when battery voltage drops below the discharge cut-off voltage Vd, the first control circuit 2 puts the discharge control transistor Q1 in the off state to suspend discharge of the rechargeable battery B.

The third control circuit 3 controls the charging control transistor Q2 on and off, based on the battery voltage measured by the battery voltage detection circuit 1, for the purpose of pulse charging the rechargeable battery B. Therefore, the third control circuit 3 outputs a high level signal when a specified time has elapsed after rechargeable battery B voltage exceeds a charge suspension voltage Vc (for example, 4.10V). Correspondingly, the third control circuit 3 outputs a low level signal when rechargeable battery B voltage drops below the charge suspension voltage Vc. Transistor 4 is turned on by a high level signal and off by a low level signal, and as a result, the charging control transistor Q2 is turned off by a high level signal and on by a low level signal.

Specifically, the charging control transistor Q2 is put in the off state to suspend charging when the specified time has elapsed after rechargeable battery B voltage exceeds the charge suspension voltage Vc. Further, rechargeable battery B charging is resumed after suspension of charging when battery voltage drops below the charge suspension voltage Vc. Subsequently, the rechargeable battery B is pulse charged by repetition of these operations.

A zener diode 5 connected between the positive terminal of the rechargeable battery B and the base of transistor 4 is for the purpose of protecting the rechargeable battery B from being charged with an excessively high voltage. Namely, if the charging voltage applied at charge-discharge terminal T1 exceeds a pre-determined voltage and becomes excessively high, the zener diode 5 conducts to forcibly put, and maintain transistor 4 in the on state. As a result, the charging control transistor Q2 goes to the off state and rechargeable battery B charging is cut-off.

The voltage detection circuit 6 measures the voltage across the (source-drain) terminals of the discharge control transistor Q1 to determine rechargeable battery B charging current. The second control circuit 7 controls transistor 4 (and as a result, charging control transistor Q2) on and off depending on measurement results from the voltage detection circuit 6.

Here, it should go without saying that a current sensing resistor could be connected in series with battery B between charge-discharge terminals T1 and T2 to determine rechargeable battery B charging current by measuring voltage across the current sensing resistor with the voltage detection circuit 6.

Figure 2:
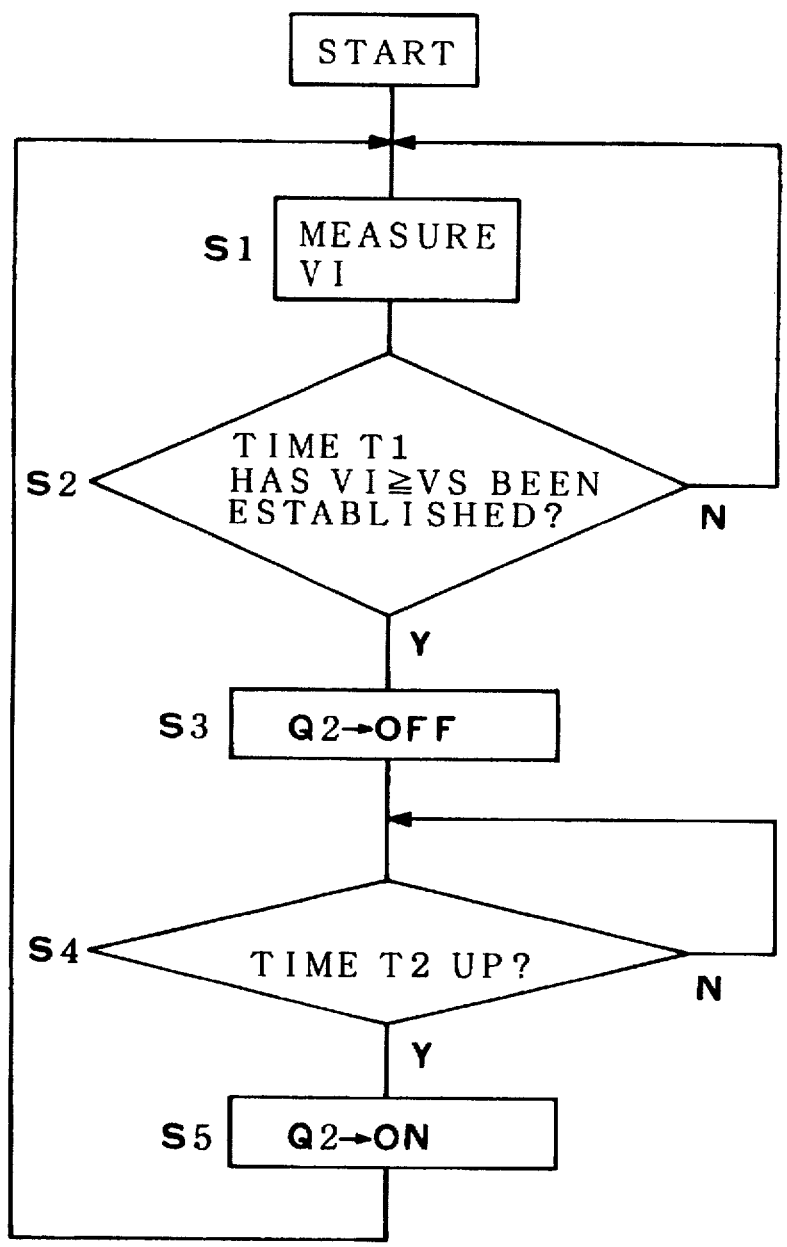
FIG. 2 is a flow-chart showing the operation of an embodiment of the present invention.

The control operation of the voltage detection circuit 6 and the second control circuit 7 is described in the following with reference to the flow-chart of FIG. 2. Charging of the rechargeable battery B is performed by connecting a battery charging power supply which outputs suitable charging voltage and current between the charge-discharge terminals T18 and T2.

First, in step S1, the voltage detection circuit 6 measures the voltage VI across the (source-drain) terminals of discharge control transistor Q1. Even in the on state, discharge control transistor Q1 has some resistance (for example, 30 mΩ). Consequently, a voltage VI (=30 mΩ×Ic) appears across the terminals of the discharge control transistor Q1 which is proportional to the charging current Ic flowing through the rechargeable battery B.

In step S2, the second control circuit 7 determines whether or not the voltage VI measured by the voltage detection circuit 6 has exceeded a specified voltage Vs for a time period greater than a first time interval T1. The specified voltage Vs is set, for example, to 0.09V for the case where it is desired to protect the rechargeable battery B with a charging current limit of 3A.

The first time interval T1 is set to a time, for example, on the order of 10 msec., that will not result in damage to discharge control transistor Q1 and charging control transistor Q2 even when more than 3A of charging current Ic flows through them. It is desirable to set the first time interval T1 approximately inversely proportional to the amount of charging current Ic.

When it is determined that the voltage VI measured by the voltage detection circuit 6 has exceeded the specified voltage Vs for a period longer than a first time interval T1, the second control circuit 7 switches transistor 4 to the on state in step S3 putting the charging control transistor Q2 in the off state to cut-off rechargeable battery B charging.

In step S4, the second control circuit 7 determines whether or not a second time interval T2 has elapsed since the charging control transistor Q2 was put in the off state. The second time interval T2 is set to a time, for example, 100 msec which will avoid damage to the discharge control transistor Q1 and the charging control transistor Q2 due to the average of a large charging current in pulse form resulting from on and off control of the charging control transistor Q2 as described below. Ideally, the second time interval T2 is also set approximately proportional to the amount of charging current Ic.

When it is determined that the second time interval T2 has elapsed since the time the charging control transistor Q2 was put in the off state, the charging control transistor Q2 is again put in the on state in step S5. Subsequently, control returns to step S1.

To summarize the preceding, the second control circuit 7 determines charging current by measuring the voltage across the discharge control transistor Q1. When more charging current than the specified value flows through the rechargeable battery B for longer than the first time interval T1, the charging control transistor Q2 is put in the off state. Further, when a second time interval T2 elapses after the charging control transistor Q2 is turned off, the second control circuit 7 returns the charging control transistor Q2 to the on state. Subsequently, on and off control of the charging control transistor Q2 is performed repeatedly (refer to FIG. 3 wave-forms) until the charging current flowing through the rechargeable battery B drops below the specified value.

Incidentally, with the present embodiment, charging protection can be provided as follows. Namely, when a rechargeable battery B is in an over-discharged state, it is necessary to reduce charging current on the order of one tenth its normal value (for example, 1C for normal charging) to prevent battery characteristic degradation. For this reason, charging current has been controlled by a battery charging power supply (not illustrated) connected between the charge-discharge terminals T1 and T2 in prior art systems.

When rechargeable battery B is in an over-discharged state in the present embodiment, the discharge control transistor Q1 is in the off state. Under these conditions, charging current flows through the over-discharged rechargeable battery B and through the parasitic diode D1 of the discharge control transistor Q1. The voltage detection circuit 6 now measures voltage VI across the terminals of the parasitic diode D1. Consequently, even though normal charging current flows through parasitic diode D1, voltage VI exceeds specified voltage Vs and the charging control transistor Q2 is switched off and on as shown in FIG. 3.

Figure 3:
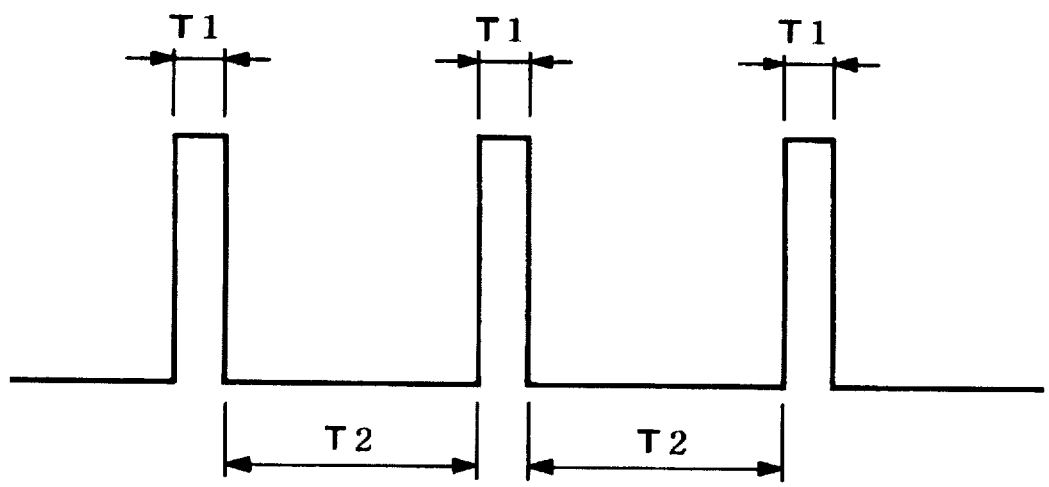
FIG. 3 is a signal wave-form diagram showing the operation of an embodiment of the present invention.

As a result, charging current flowing through the over-discharged rechargeable battery B becomes a pulse waveform as shown in FIG. 3, and average current is reduced. Therefore, charging current control in the battery charging power supply connected between the charge-discharge terminals T1 and T2 becomes unnecessary.

Furthermore, since charging current flowing through the parasitic diode D1 of the discharge control transistor Q1 is also a pulse wave-form, no unanticipated heat is generated by the discharge control transistor Q1.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims or equivalence of such metes and bounds thereof are therefore intended to be embraced by the claims.

What is claimed is:

1. A rechargeable battery protection circuit comprising:
   (1) a rechargeable battery;
   (2) a discharge control switching system connected in series with the rechargeable battery;
   (3) a charging control switching system connected in series with the rechargeable battery;
   (4) a discharge control circuit to measure rechargeable battery voltage and switch the discharge control switching system to an off state when battery voltage drops below a specified voltage; and
   (5) a charging control circuit to measure voltage across terminals of the discharge control switching system and control the charging control switching system to be switched between an on state and an off state;

wherein the charging control circuit puts the charging control switching system in the off state when the voltage across the terminals of the discharge control switching system exceeds a specified voltage for longer than a first time interval, and when a second time interval elapses after the charging control switching system is put in the off state, the charging control system returns the charging control switching system to the on state.

2. A rechargeable battery protection circuit as defined in claim 1 wherein the discharge control switching system is a MOSFET, which has an internal parasitic diode, and which is connected in series with the rechargeable battery in a manner that allows a charging current to flow through the parasitic diode when the MOSFET is in an off state.

3. A rechargeable battery protection circuit as defined in claim 1 wherein the discharge control circuit is provided with a battery voltage detection circuit, and a control circuit to control the discharge control switching system with output from the battery voltage detection circuit.

4. A rechargeable battery protection circuit as defined in claim 2 wherein the charging control circuit is provided with a voltage detection circuit to measure the voltage of the MOSFET and a control circuit to control the charging control switching system with output from the voltage detection circuit.

5. A rechargeable battery protection circuit as defined in claim 1 wherein the charging control circuit is provided with a control circuit to switch the charging control switching system on and off to pulse charge the rechargeable battery.

* * * * *